United States Patent [19]

Jones et al.

[11] Patent Number: 4,683,387
[45] Date of Patent: Jul. 28, 1987

[54] QUADRATURE SWITCH APPARATUS FOR MULTI MODE PHASE SHIFT DRIVERS

[75] Inventors: Franklin B. Jones, Baltimore; Walter E. Milberger, Severna Park; Charles S. Kerfoot, Pasadena, all of Md.

[73] Assignee: The United States of America as represented by the Secretary of the Air Force, Washington, D.C.

[21] Appl. No.: 804,194

[22] Filed: Dec. 3, 1985

[51] Int. Cl.⁴ .............. H03K 17/687; H03K 19/16; H01J 29/70
[52] U.S. Cl. .................. 307/571; 307/270; 307/572; 307/314; 315/408
[58] Field of Search .......... 307/270, , 254, 255, 307/570, 314, 571, 572, 263; 363/132; 315/403–408

[56] References Cited

U.S. PATENT DOCUMENTS 3,621,474  11/1971  Ballasiewicz et al. .......... 307/472
3,714,461   1/1973  Dodson ......................... 307/227
3,934,173   1/1976  Korver ......................... 315/408
4,039,862   8/1977  Dingwall et al. ............. 307/247 R
4,425,518   1/1984  Milberger ..................... 307/571
4,532,443   7/1985  Glennon ....................... 307/270
4,540,899   9/1985  Pelly .......................... 307/270

Primary Examiner—Stanley D. Miller
Assistant Examiner—B. P. Davis
Attorney, Agent, or Firm—William Stepanishen; Donald J. Singer

[57] ABSTRACT

A field effect transistor (FET) quadrature switch for the control of multi mode microwave phase shifters provides bi-directional random mode switching while using only one power supply. The switch apparatus provides high speed, high voltage, and high-current switching while reducing the stand off voltage requirement of the linear driver, the number of switching elements which are required for mechanization, and reducing the size, weight and the complexity of the apparatus.

4 Claims, 12 Drawing Figures

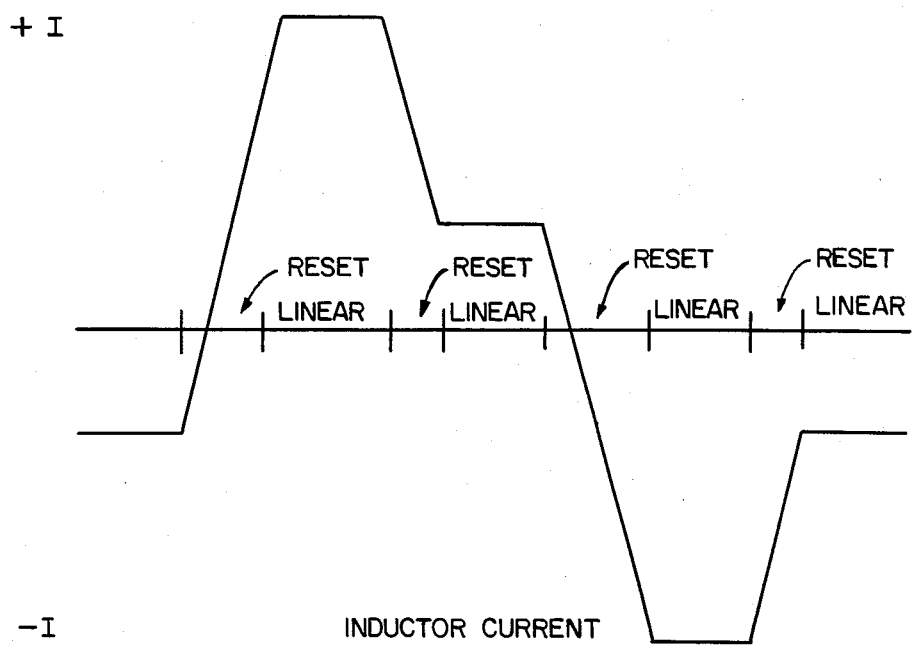
FIG.IA
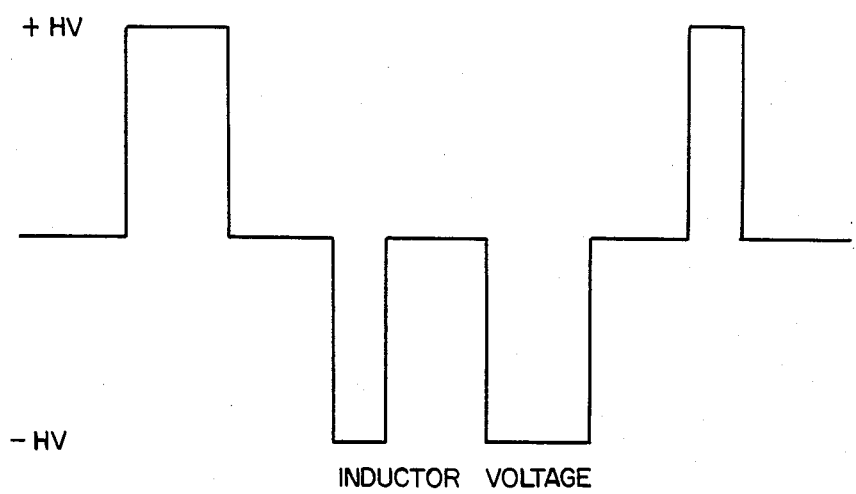
FIG.IB

|   | A | B | C | D | E | F | G | H | A |
|---|---|---|---|---|---|---|---|---|---|
| 1 | O | O | X | X | X | O | O | O | O |
| 2 | X | O | O | O | O | O | X | X | X |
| 3 | O | O | O | O | X | X | X | O | O |
| 4 | X | X | X | O | O | O | O | O | X |

…

QUADRATURE SWITCH APPARATUS FOR MULTI MODE PHASE SHIFT DRIVERS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a linear driver switch apparatus, and in particular to a bi-directional random-mode field effect transistor (FET) switch apparatus that is used for the control of microwave ferrite phase shifters and CRT deflection yokes.

The term switch or switching device is usually used to denote that class of device which is intended to function when an electrical circuit is energized or deenergized under normal operating conditions. In contrast a well known power device such as the circuit breaker has as one of its primary functions the interruption of short circuit currents. Although there are many different types of electric switches their application can be broadly classified into two major categories; power and signal.

In a power application, the function of a switch is to apply energy or remove energy from an electric load. A few examples of the low end of the power scale, includes wallswitches which are used in homes and offices for turning lights on and off; and, dial and push button switches which control power to electric ranges, washing machines and dishwashers. At the high power end of the scale are load-break switches and disconnect switches in power systems which operate at very high voltage.

For high power applications, the switches are required to carry a certain amount of continuous current without overheating when closed, and in the open position they must provide enough insulation to isolate the circuit electrically. The latter function is particularly important in high voltage circuit because it is the practice in the electrical industry to forbid people from working on electrical equipment unless it is isolated from the electrical supply system by a visible break in air. The present invention provides a means of connecting a high voltage source to a load.

The electronic drive for an S-band attenuator which was developed under an Air Force Program for the control of a high power mircrowave source, required a unipolar high voltage switching device for rapid reset. In order to allow the use of a second microwave input, the electronic drive had to be expanded to accommodate bi-directional switching, which doubled the driver size and weight.

The MOSFET quadrature switch apparatus was developed to accomplished bi-directional high voltage, high current switching with reduced size and weight. The configuration is capable of random-mode switching, and the improves recovery of energy from the inductive load, due to the use of a single high voltage power supply.

SUMMARY OF THE INVENTION

The present invention utilizes a series-parallel switch configuration which is comprised of power MOSFET devices to drive an inductive load from a single floating high voltage power supply. The series-parallel power MOSFET switching circuit provides high voltage, high power bi-polar switching at high speed random mode programming to any load source including resistive and capacitive loads or any combination thereof.

It is one object of the present invention, therefore, to provide an improved quadrature switch apparatus for a multi-mode phase shift driver circuit.

It is another object of the invention to provide an improved quadrature switch apparatus wherein a single controller is used to provide reciprocal functions.

It is another object of the invention to provide an improved quadrature switch apparatus wherein the component count is reduced by the elimination of one power supply and one third of the switching devices.

It is another object of the invention to provide an improved quadrature switch apparatus wherein the use of a series-parallel switching configuration increases the current and/or voltage capacity.

It is another object of the invention to provide an improved quadrature switch apparatus wherein the switches can open and close at 150 KHz to accommodate random mode programming.

It is another object of the invention to provide an improved quadrature switch apparatus wherein the linear driver is isolated from switching transients that are generated by an inductive load.

It is another object of the invention to provide an improved quadrature switch apparatus wherein each switch unit stands off only one half of the high voltage than was previously required.

It is another object of the invention to provide an improved quadrature switch apparatus wherein the use of a discrete gate to source capacitor prevents parasitic oscillations, gate-to-source puncture, and destructive Miller integration due to inductive loads.

It is another object of the invention to provide an improved quadrature switch apparatus wherein input chokes are used to prevent transistor failure due to field effect transistor diode recovery which is the result of the reverse current from the inductive load.

It is another object of the invention to provide an improved quadrature switch apparatus wherein ferrite beads are used to prevent oscillations which result from the random switching of the bridge switch configuration.

It is another object of the invention to provide an improved quadrature switch apparatus wherein limiting resistor are utilized in the field effect transistor gate reset circuit to prevent false turn-on after off command.

These and other advantages, objects and features of the invention will become more apparent after considering the following description taken in conjunction with the illustrative embodiment in the accompanying drawings.

BRIEF DESCRIPTION OF THE DRAWINGS

FIG. 1A is a graphical representation of a typical current waveform for a linear driver circuit which requires a bi-directional reset, FIG. 1B is a graphical representation of the high voltage waveform which is applied to a linear driver circuit.

DESCRIPTION OF THE PREFERRED EMBODIMENT

The magnetic coils which are used in phase shifter and deflection yoke circuits are, at present, large inductive loads, that typically must be driven linearly for a time, and then followed for a time by a rapid reset to the initial condition. In other cases, the yoke may be operated in a random acess mode in which it is switched directly from state to state. This is generally accomplished using a low voltage driver for linear operation, and high voltage reset switches. The disadvantages of this approach include the high voltage standoff requirements for the switches and the linear driver, and the need for duplicate high voltage power supplies if a bi-directional circuit is desired. The quadrature switch apparatus provides a means for random switching with a single power supply, while eliminating the voltage standoff requirements for the linear driver.

There is shown in FIG. 1A typical current waveform for a deflection yoke circuit which requires a bi-directional reset control signal. The initial coil current is controlled by the linear driver. The current is reset to arbitrary values between the linear periods of the waveform. High voltage must be applied across the coil as shown in FIG. 1B.

Figure 2:
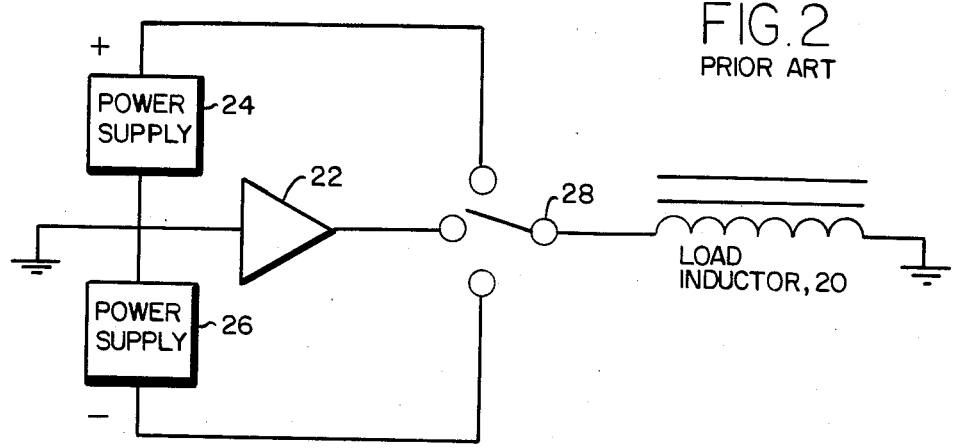
FIG. 2 is a block diagram of a prior art linear driver circuit.

In FIG. 2 there is shown the prior art circuit for driving an inductive load, 20. A linear driver unit 22 is utilized in conjunction with a pair of power supply units 24, 26 to energize the inductive load 20. A switching unit 28 is positioned between the linear driver unit 22, the power supply units 24, 26 and the load inductor 20.

The load inductor 20 is grounded at one end and connected to the switch unit 28 at the other end. For fast reset in either direction, the coil (load inductor 20) is connected to either one of the two fixed high voltage power supplies 24, 26 by means of the switch unit 28. The use of the higher voltages allows faster reset, but each arm of the opposite must withstand twice the reset voltage (neglecting the linear drive voltage).

Figure 3:
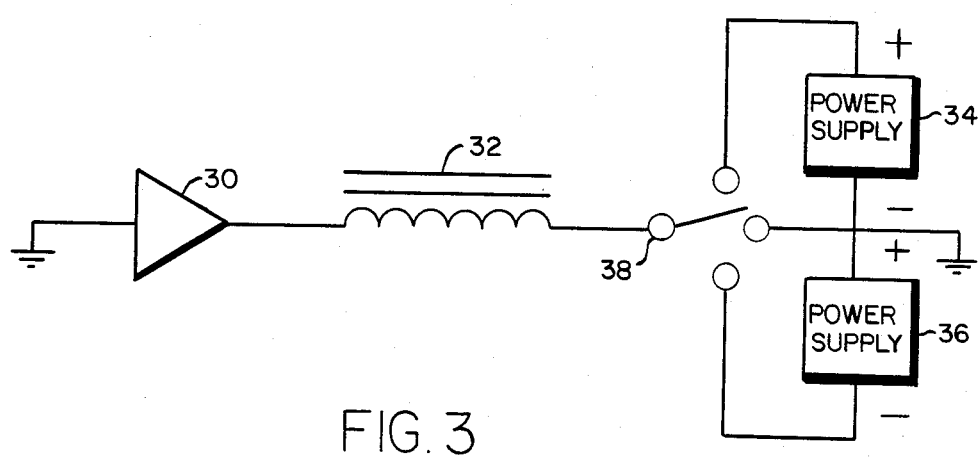
FIG. 3 is a block diagram of an improvement of the linear driver circuit of FIG. 2.

The first modification to the prior art configuration is shown in FIG. 3. The high voltage reset switch unit 38 and power supply units 34, 36 are moved to the opposite side of load inductor 32 from the linear driver unit 30. The switching configuration remains unchanged, but the linear driver unit 30 is separated from the switch unit 38. The total series impedance for the circuit remains unchanged from that shown in FIG. 2.

Figure 4:
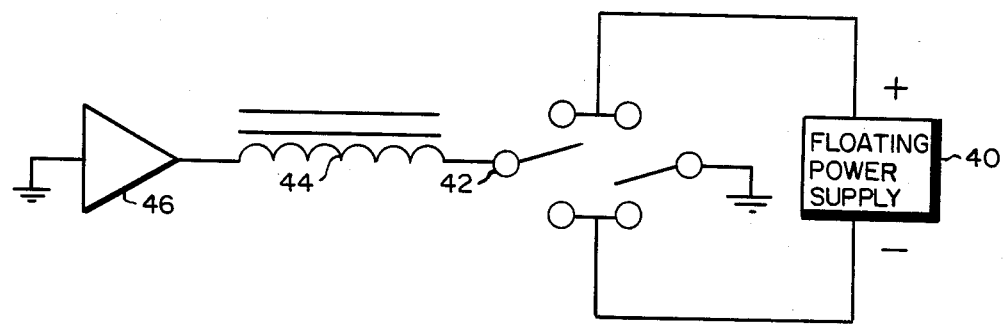
FIG. 4 is a block diagram of the quadrature switch apparatus for a multi-mode phase shift driver.

The second change in the linear driver circuit configuration permits the elimination of one power supply. Since the reset operation occurs in only one direction at a time, it is only necessary that one of the power supplies be in use at a time. Rather than using two power supplies of a fixed polarity each, a single floating power supply unit 40, as shown in FIG. 4, may be utilized. The switch unit 42 remains positioned between the floating power supply unit 40 and the load inductor 44. The linear driver unit 46 remains, as in FIG. 3, between the load inductor 44 and ground. By switching the proper pole of the switch unit 40, to ground, the power supply unit 40 may be changed to either polarity, and can be inverted by changing the grounded pole.

The load inductor 44 may then be either grounded or switched to the reset voltage. Each portion of the switch unit 42 stands off only half as much voltage as before. This results in the use of only two thirds as many switching devices in the total circuit. The series impedance is unchanged for linear operation, and decreased to one half of the previous impedance during the reset operation.

Figure 5:
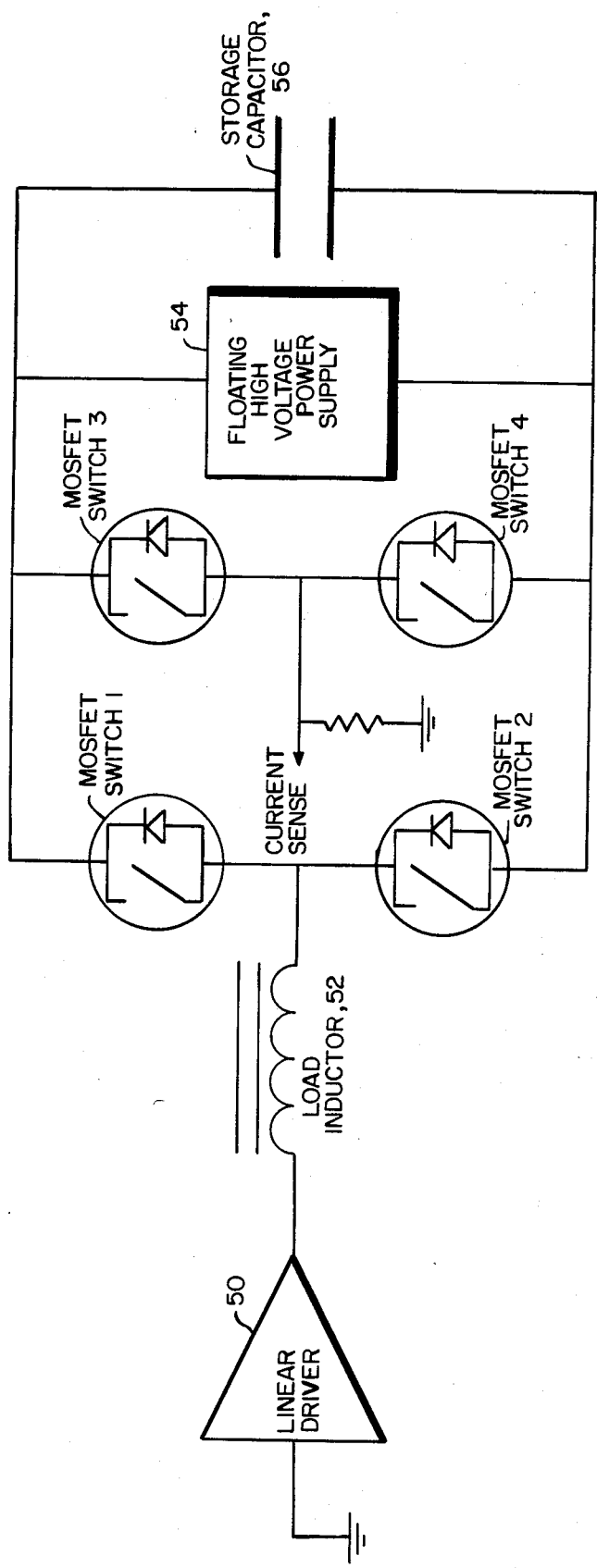
FIG. 5 is a schematic diagram of the quadrature switch apparatus according to the present invention.

Turning now to FIG. 5, there is shown a quadrature switch apparatus wherein MOSFET switches 1-4 are utilized to provide the linear and the reset operations. As described in FIG. 4, the linear driver unit 50 controls the linear circuit operation from one end of the load inductor 52. A switching unit which is comprised of a set of switches MOSFET switches 1-4 and the single floating power supply unit 54 are positioned on the opposite side of the load inductor 52. The floating high voltage power supply unit 56 has a storage capacitor 56 connected across it. Each of the four switches (MOSFET switch 1-4) is shown with a diode across it. The diode is an intrinsic portion of the MOSFET with which it is actually used. These diodes are necessary to allow sequential switching, and are utilized to avoid the switch-through currents that may occur with simultaneous switching.

Figure 6A:
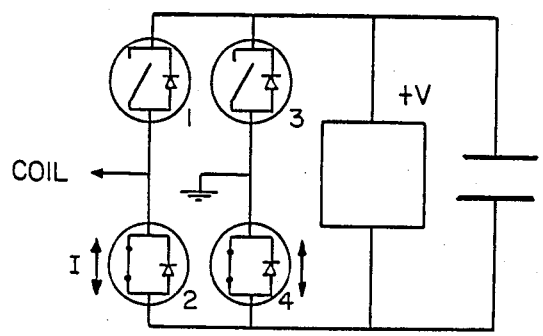
FIGS. 6A-6E are schematic diagrams of the quadrature switch apparatus in various operating stages, and, FIG. 7 is a schematic diagram of the quadrature switch apparatus for a linear driver circuit application.
Figure 6B:
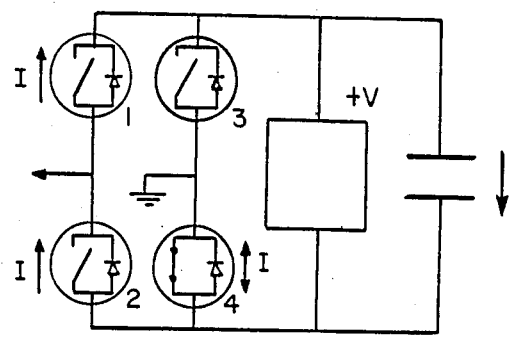
Figure 6C:
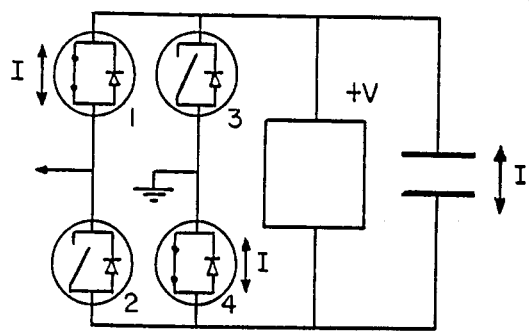
Figure 6D:
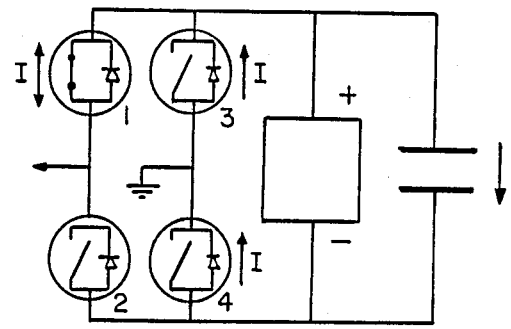
Figure 6E:
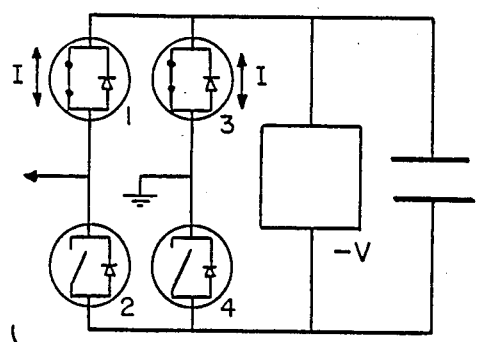

The particular switching sequence that the present apparatus is utilized to perform is chosen to suit the application. Turning now to FIGS. 6A-6E, there is shown the switch unit switching configurations to perform reset operations in alternating directions. For the present invention, it will be assumed that the inductor load which is shown in FIG. 6A as a coil, in the initial condition is grounded, and the current is flowing in either direction. In FIG. 6B, the switch unit configuration is changed by opening switch 2 on command. The coil (inductor load) will then either draw current through the diode of switch 2, with the voltage clamping to ground, or will provide current through the diode of switch 1 to the storage capacitor, with the voltage clamping to +V side of the power supply unit, depending on the initial current. After switch 2 is opened, switch 1 is closed, thereby connecting the coil directly to +V side of the power supply unit, with current passing in either direction. This operation is shown in FIG. 6C. When the desired current level is reached, switch 4 is opened, as shown in FIG. 6D. in sequence switch 3 is closed, as shown in FIG. 6E. The coil is now grounded for linear operation, again, and the polarity of the power supply unit has been reversed. The reset operation in the opposite direction is accomplished in a similar fashion. Switching in the same direction consecutively is accomplished by omitting the switching of switches 3 and 4, so that the high voltage polarity does not change. An arbitrary reset sequence can be accomplished by the use of appropriate commands.

Figure 7:
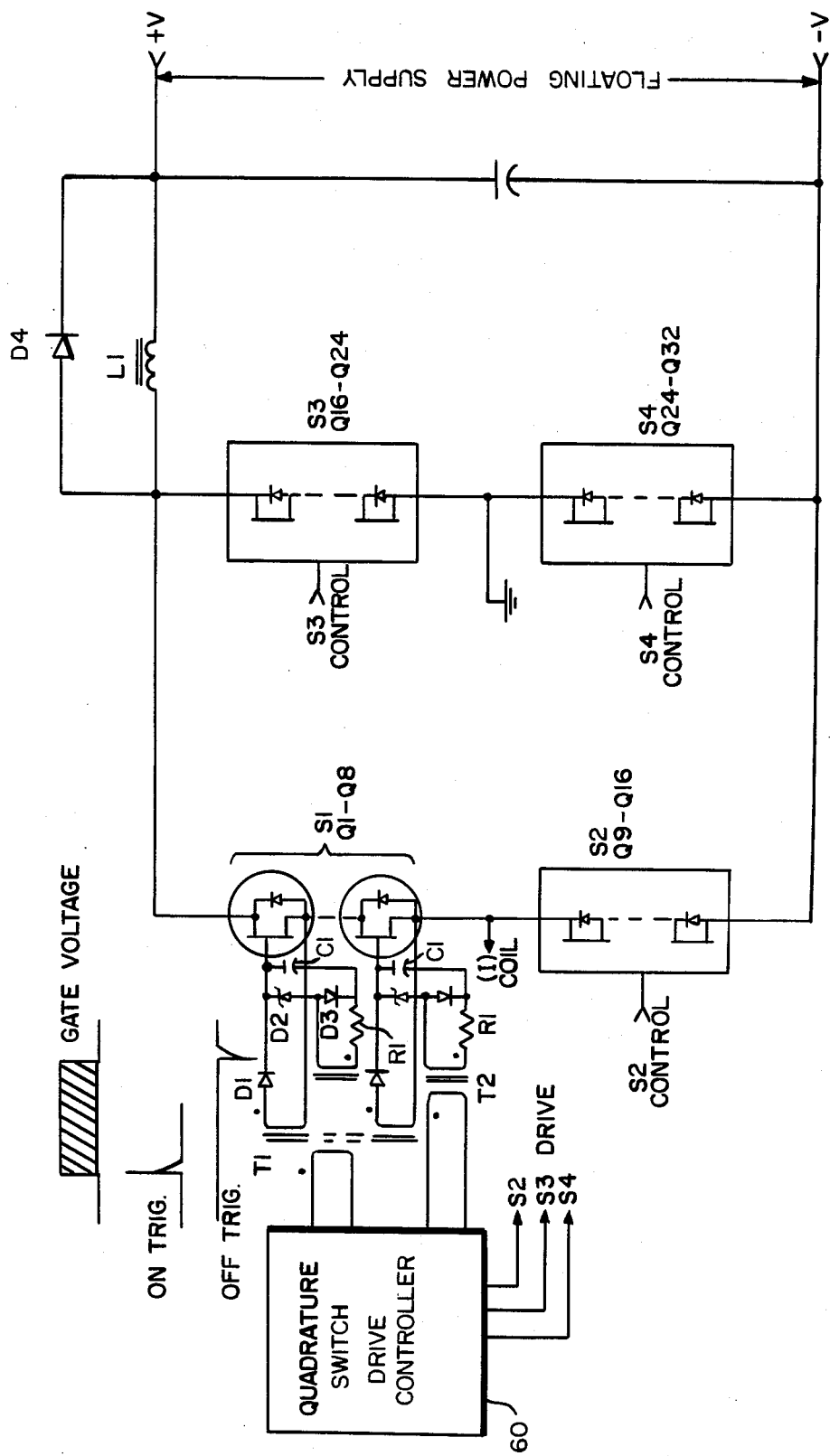

In FIG. 7 there is shown an application of the field effect transistor quadrature switch apparatus that may be utilized in the high power S-band attenuator. It will be noted that the switch units 1-4 of FIG. 6 were shown as mechanical switch legs of single pole toggles switches that were shunted with a pass diode. For the present discussion of FIG. 7, the components of only switch S1 are shown in any detail. However, it should be pointed out that the components of switch S1 are also used in each field effect transistor switch leg, S2-S4. In other words, the switches S2, S3 and S4 are identical to the switch S1 leg. Each switch leg is comprised of eight power MOSFET'S in series. Although 1,000 volt devices are now available for use, 500 volt Motorola MTM15N50 transistors are used to provide a 4 KV standoff voltage in each of the switch legs of the switch units S1–S4. These transistor devices afford a minimal on resistance (0.4 ohms) at a maximum sustained current of approximately 15 amperes.

U.S. Pat. No. 4,425,518 to Walter E. Milberger, describes a variety of techniques to control the gate drive of series connected field effect transistors. However, only the quadrature switch drive controller unit, 60 which is shown in FIG. 7, and is utilized to operate the quadrature switch units S1–S4, is discussed. The quadrature switch drive controller unit 60 applies a positive 20-volt ON trigger signal to each of the eight series connected transistors (switch units S1–S4) from their corresponding four phase quadrature drive control line. This trigger signal is transmitted to the field effect transistor gates by means of transformer T1 and the stand off diodes, D1. This action causes the field effect transistor gate to source capacitance to charge up to a voltage which limited by the zener D2 didode. In order to sustain the switch ON state beyond the R-C time constant of the gate to source, the ON trigger signal is repeated at a rate of 150 KHZ. At such time as the command signal to open the switch is initiated, an Off trigger signal is applied to the field effect transistor gates by means of transformer T2.

The Westinghouse Electric Corporation has designed single pole series connected field effect transistor switches for voltages in excess of 10 KV. These switching devices were used to pulse resistive or capacitive loads. When inductive loads such as a high power attenuator yoke (250 MH) are pulsed, extremely high-voltages (L di/dt) and high energies ($LI^2/2$) are present. These conditions can result in positive-going high-speed, high-voltage transients of extremely low source impedance. These transients are coupled into the field effect transistor gate via the Miller capacitance. Even though a zener diode (D2) shunts the field effect transistor gate to source, its dynamic impedance is too high to prevent gate puncture when high energy transients are imposed. In order to circumvent this failure mode, an extremely large discrete gate-to-source capacitor, (C1) must be added. The capacitor value is contingent on the specific energy content involved. Without this addition, the quadrature switch components are doomed to failure. This capacitor also suppresses parasitic oscillations which are inherent in the field effect transistor circuit configuration.

The reverse voltages which are generated by the collapsing field of the inductor are clamped to the power supply through the internal drain to source diodes in the switching field effect transistors. This diode must be allowed a sufficient reverse recovery time before the reverse voltage is applied. If this is not done, a second avalanche will occur, and will result in transistor failure. An inductive clamp which is comprised of inductor L1 and diode D4 prevents this failure mode.

In view of the switching requirements of the switch units S1–S4, a potential problem may occur in the field effect transistor gate drive circuit. As a result of forward current flowing through diode D1 during the turn-off command, a reverse voltage (positive-going) is generated in transformer T1 after the reset. This causes the transistor to turn back on ("after birth"). In order to prevent this effect, resistor R1 is added in all secondaries of off transformers, T2. This resistor R1 limits the forward current flow the through the diode D1 and thereby reduces the reverse voltage below the transistor gate threshold voltage.

Another problem which is inherent in the quadrature switch circuit, but which is not present in the single pole switch configuration, is parasitic oscillations. The quadrature switch circuit is similar to a bridge chopper, the difference being that the ground reference of the chopper is the bottom of switches S2 and S4. The quadrature switch unit is referenced to the ground at juncture of switches S3 and S4. Furthermore, the chopper is programmed as a balanced bridge and the quadrature switch apparatus is not. In the case of the balanced bridge, any regenerative action which occurrs in one leg, is balanced out by the complementary branch. This is not true in quadrature switch apparatus, so parasitic oscillations are not only common but are of such an intensity as to cause transistor failure. In order to prevent these oscillations, ferrite beads must be added in each switch leg to de-Q the resonant tank. All the circuit innovations herein described are noted in FIG. 7 by an asterisk. These features are considered essential for proper quadrature switch operation.

The quadrature switch apparatus as herein described is applicable for use with resistive and capacitive loads as well as inductive loads. The salient features include high-voltage, high power bi-polar switching at high-speed random mode programming. The principles of the quadrature switch apparatus were evolved during the development of the high power S-band attenuator and provide an important advancement in field effect transistor switching technology. In the spirit of the invention, the principles of the present invention can also be applied to switching devices other than field effect transistors. When the present invention is utilized in conjunction with a linear driver, the quadrature switch apparatus becomes a very versatile tool for many different applications in future programs.

Although the invention has been described with reference to a particular embodiment, it will be understood to those skilled in the art that the invention is capable of a variety of alternative embodiments within the spirit and scope of the appended claims.

What is claimed is:

1. A quadrature switch apparatus for multi-mode phase shift drivers comprising in combination:
   an impedance means,
   a linear driver means operatively connected to one end of said impedance means, said linear driver means applying a linear drive signal to said impedance means,
   a switch means operatively connected to the other end of said impedance means, said switching means to provide high speed bi-directional high voltage random mode switching, said switch means including a switchable ground reference, said switch means comprises a first and second MOSFET switch means in series and a third and fourth MOSFET switch means in series, said first and second MOSFET switch means is in parallel with said third and fourth MOSFET switch means, a first junction between said first and second switch means operatively connected to said impedance means, a second junction between said third and fourth MOSFET switch means operatively connected to ground, a third junction between said first and third MOSFET switch means operatively connected to one side of said high voltage power supply means, a fourth junction between said second and fourth MOSFET means operatively connected to the other side of said high voltage power supply means, and, a high voltage power supply means operatively connected to said switch means, said high voltage power supply means being floating with respect to said ground reference, said high voltage power supply means being switchably connected to said impedance means to provide a bi-directional high voltage reset signal to said impedance means.

2. A quadrature switch apparatus as described in claim 1 including a capacitive storage means operatively connected across said high voltage power supply means.

3. A quadrature switch apparatus as described in claim 1 wherein each MOSFET switch means of said first, second, third and fourth switch means comprises respectively a plurality of MOSFET devices which are operatively connected in series.

4. A quadrature switch apparatus as described in claim 3 wherein each MOSFET device of said plurality of MOSFET devices includes a diode means operatively connected across said MOSFET device between its source and drain.

* * * * *